United States Patent
Lai

(10) Patent No.: US 7,816,770 B2
(45) Date of Patent: Oct. 19, 2010

(54) DEVICE AND METHOD FOR HERMETICALLY SEALING A CAVITY IN AN ELECTRONIC COMPONENT

(75) Inventor: Aymeric Lai, Grenoble (FR)

(73) Assignees: Commissariat a l'Energie Atomique, Paris (FR); Centre National d'Etudes Spatiales, Paris (FR)

(*) Notice: Subject to any disclaimer, the term of this patent is extended or adjusted under 35 U.S.C. 154(b) by 697 days.

(21) Appl. No.: 11/721,128

(22) PCT Filed: Dec. 13, 2005

(86) PCT No.: PCT/FR2005/051077
§ 371 (c)(1),
(2), (4) Date: Jun. 7, 2007

(87) PCT Pub. No.: WO2006/064158
PCT Pub. Date: Jun. 22, 2006

(65) Prior Publication Data
US 2009/0261535 A1  Oct. 22, 2009

(30) Foreign Application Priority Data
Dec. 15, 2004  (FR) .................................. 04 52994

(51) Int. Cl.
*H01L 23/48* (2006.01)
(52) U.S. Cl. ............... 257/666; 257/677; 257/E23.041; 257/E23.193; 257/729; 257/789
(58) Field of Classification Search ................ 257/666, 257/677, E23.041, E23.193
See application file for complete search history.

(56) References Cited

U.S. PATENT DOCUMENTS

| | | | | |
|---|---|---|---|---|
| 4,635,549 A | * | 1/1987 | Bleckmann et al. | 101/401.1 |
| 4,732,042 A | * | 3/1988 | Adams | 73/706 |
| 4,733,872 A | * | 3/1988 | Sugimura | 411/82 |
| 6,247,493 B1 | * | 6/2001 | Henderson | 137/487.5 |
| 6,757,155 B2 | * | 6/2004 | Koike et al. | 361/600 |
| 6,851,276 B2 | * | 2/2005 | Perrins | 62/457.5 |
| 2001/0055831 A1 | | 12/2001 | Daneman et al. | |
| 2003/0111441 A1 | | 6/2003 | Jerominek et al. | |
| 2007/0218585 A1 | | 9/2007 | Robert | |

FOREIGN PATENT DOCUMENTS

JP  2002-190548  7/2002

OTHER PUBLICATIONS

Shung-Wen Kang, et al., "Fabrication and Test of Radial Grooved Micro Heat Pipes", Applied Thermal Engineering, vol. 22, 2002, pp. 1559-1568.

* cited by examiner

*Primary Examiner*—Zandra Smith
*Assistant Examiner*—Tsz K Chiu
(74) *Attorney, Agent, or Firm*—Oblon, Spivak, McClelland, Maier & Neustadt, L.L.P.

(57) ABSTRACT

To hermetically seal a cavity in a microelectronic component, a cap located in a sealing device is positioned above the orifice opening into the cavity. The cap plastically deforms to seal the cavity. The sealing device includes a cavity permitting the cavity of the microelectronic component to be filled. The sealing device slides along the component so as to be positioned opposite either the filling cavity, or the cap.

20 Claims, 3 Drawing Sheets

DEVICE AND METHOD FOR HERMETICALLY SEALING A CAVITY IN AN ELECTRONIC COMPONENT

TECHNICAL FIELD

The invention relates to components in which a cavity, especially leak proof, is present. More particularly, the invention relates to the hermetic sealing after filling and/or the placing under vacuum of a cavity in a microelectronic component.

In one aspect, the invention relates to a sealing process by the sliding of a device which permits a cavity to he hermetically sealed, as well as sealing means permitting such obstruction.

Thanks to the process and the device of the invention, the placing under vacuum and/or the filling of the cavity may be carried out using the same device as for the sealing.

STATE OF THE PRIOR ART

Certain microelectronic components have cavities, used for example to protect components. The cavities are then either placed under vacuum, or filled with fluid, but, in any case, in many applications, the cavities must then remain hermetic and their environment controlled.

The most commonly adopted solution to this end is, until now, the use of a filling conduit fitted when the component is manufactured. This conduit may be made at the same time and of the same material as the envelope of the cavity to be filled, or fixed (for example glued or brazed) to a hole made in the material which envelopes the cavity. Once the cavity is placed under vacuum and filled with fluid by means of the conduit, the latter is clamped or melted, or a cover is welded on, in order to obtain a hermetic tip.

Another solution for filling caloducts was described by Kang S-W and coll. ("Fabrication and test of radial grooved micro heat pipes", *Applied Thermal Engineering* 2002; 22: 1559-68). An encapsulation device made of silicon is used, which comprises two cavities: one of the cavities, which is open, is connected to a vacuum pump, and the other, which has a fine membrane over it, is made to play the role of a partition which can be pierced while still keeping it impervious (or "septum") for filling. Initially, the cavity connected to the pump is placed above the filling hole of the caloduct; once the desired vacuum has been achieved, the device is moved to obstruct the hole and the second cavity is positioned opposite the filling hole, in order to introduce the liquid using a syringe.

If such a device allows the cavity to be kept sealed between when in is placed under vacuum and when it is filled, the problem of the sealing of the cavity of the device, in this case the caloduct, is not covered: in particular, as the filling liquid is water, then traditional encapsulation covers may be used.

However, this solution, like the others described in the state of the technique, creates problems in the event of very compact or a very small size of the system being required, due to the volume of the tip: indeed, the creation of the hermetic seal leads to the formation of a protuberance of the envelope that is inherent to the seal. In particular, the envelope obtained is not flat.

DESCRIPTION OF THE INVENTION

The invention proposes to overcome the disadvantages mentioned and to permit the sealing of a cavity of a microelectronic component leading to a most compact size.

In one of its aspects, the invention relates to a sealing process of the cavity of a microelectronic component thanks to a cap of which at least a part is capable of being plastically deformed.

Preferably, the plastic deformation consists of the melting of part of the cap made of the meltable material and advantageously located around a part of the cap that is made of inert material. Preferably, the part made of inert material of the cap is of the same composition as the material of the surface of the electronic component. Furthermore it is possible to coat the surface, around the orifice to be sealed, of the component meltable material also.

Another embodiment relates to a soft metal cap that is plastically deformed by the application of pressure.

The cap is preferably integrated into the surface of a sealing device which can slide on the surface of the component comprising the orifice leading to the cavity to be sealed; in particular, the cap is housed in a first cavity of the sealing device. During the sealing process, the device, which advantageously comprises a second, cavity permitting the creation of the vacuum and/or the filling via the orifice, is moved on the surface so that it positions the cap opposite the orifice of the component. A plastic deformation of the cap then permits impervious sealing.

In order to obtain hermetic sealing, it is preferable for grease to be placed at the interface between the two sliding surfaces. The sliding may be guided by means of grooves or stops on the device and/or around the hole in order to permit alignment for example.

Thanks to the process of the invention, it is possible to dimension the cap and the orifice so that, once the plastic deformation has been carried out, the cap does not protrude above the surface of the component.

In another aspect, the invention relates to a sealing device that permits the previous process to be used. In particular, such a device may be associated to an electronic component comprising a cavity so as to make possible its hermetic sealing. The device of the invention comprises a cap which may be deformed plastically to obstruct an orifice. The device may comprise one or more cavities, which may possibly communicate with the environment of the cap, combined with filling and/or placing under vacuum means.

The invention also relates to a cap that may be used in the device or with the previous processes.

BRIEF DESCRIPTION OF THE DRAWINGS

The characteristics and advantages of the invention will be more clearly understood upon reading the following description and in reference to the appended drawings, provided by way of illustration and in no way restrictively.

DETAILED DESCRIPTION OF SPECIFIC EMBODIMENTS

Figure 1:
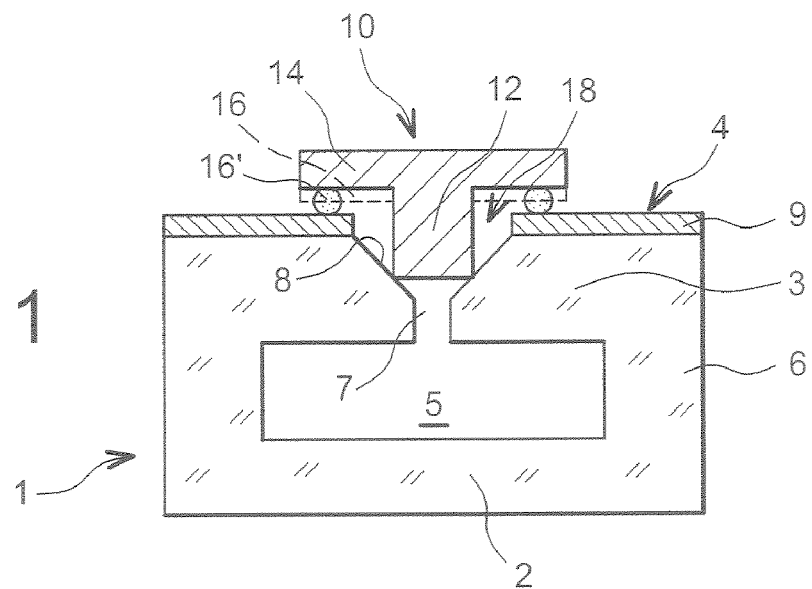
FIG. 1 shows a microelectronic device whose cavity has been sealed by a process of the invention.

The micro electronic devices, as shown in FIG. 1, are especially concerned by the sealing of the invention. A microelectronic component 1, with a thickness of around 1 mm for a surface area of around 1 cm², thus generally comprises a substrate 2 and an upper layer 3, possibly of the same nature; most of the time, the external surface 4 of the upper layer 3 is flat. In the component 1 there is a cavity 5 that is surrounded by the substrate 2, the upper layer 3, and lateral walls 6, whose height depends on what they are used for; usually, the cavity 5 is in a component 1 made of silicon. The cavity 5 opens onto the external surface 4 of the component 1 via an orifice 7. Preferably, the orifice 7 is as small as possible at the cavity, for example included in a circle of a diameter of between 100 μm and 1 mm; the orifice 7 may however comprise a flared mouth 8 at the external surface 4 of the component 1, which is generally a layer 9 of metal.

According the invention, the cavity 5 is hermetically sealed by means of a cap 10 positioned at the orifice 7, in a first embodiment, the cap 10 has the shape of a mushroom, whose base 12 is, if possible, of a size that can enter the hole 7, 8. Advantageously, the base 12 is larger in size than the orifice 7 at the level of the cavity 5 and smaller at the surface of the mouth 8 at the level of the external face 4 of the component 1: the cap 10 may therefore be at least partially located in the mouth 3 and seal the orifice 7. The cap 10 is to have the lowest height possible, for example of the order of a few hundred microns, in particular between 100 μm and 1 mm.

In this embodiment, one cap 10 comprises a core (base 12, cover 14) component made of an inert material, preferably identical in nature to that of the upper layer 3, which is to say a semi-conductor, for example silicon. Furthermore, one face of the cap 10 which may come into contact with one external surface 4 of the component 1 is coated with a meltable material 16, which may for example be a metal such as tin, nickel or gold (in particular for the adhesion), or lead or indium, a mixture of these metals, as well as their alloys. In particular, the bottom of the cover 14 is coated with this material 16 (see clotted lines) that is plastically deformable. Once the cap 10 has been fitted, an increase in temperature permits the material 16 to melt, which then comes into contact with the metal layer 9 and bonds to it (solid lines); advantageously, the metal 9 is selected appropriately, in particular for its adhesion (for example, it may be a layer or a succession of layers of Ti/Ni/Au), but it is also possible no have a direct contact on the silicon of the upper layer 3. The sealing is thus hermetic, with the meltable material 16' which forms an impervious chamber 18 around it, between the cap 10 and the mouth 8.

Figure 2:
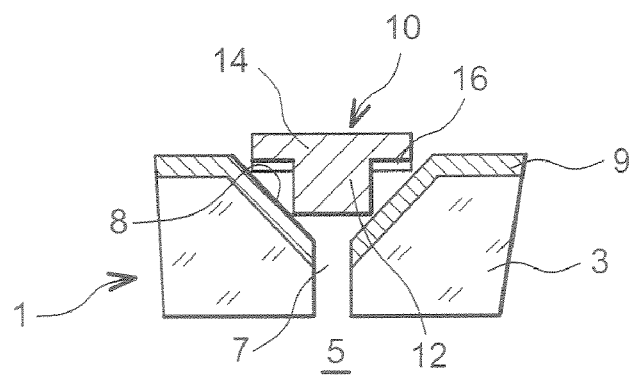
FIG. 2 shows a sealing alternative of the invention.

It is furthermore possible to provide a height of the base 12 and the cover 14 such that the cap 10 is entirely located in the mouth 8 once the fusion has taken place: refer to the diagram in FIG. 2, in which the fusion has not taken place (the meltable material 16 is located below the cover 14). In this case, it could be preferable to metallise the walls of the mouth 8 also. In this way, the sealing is more compact, and the component 1 is flat.

In return, it is possible to have an orifice 7 of large dimensions.

Figure 3A:
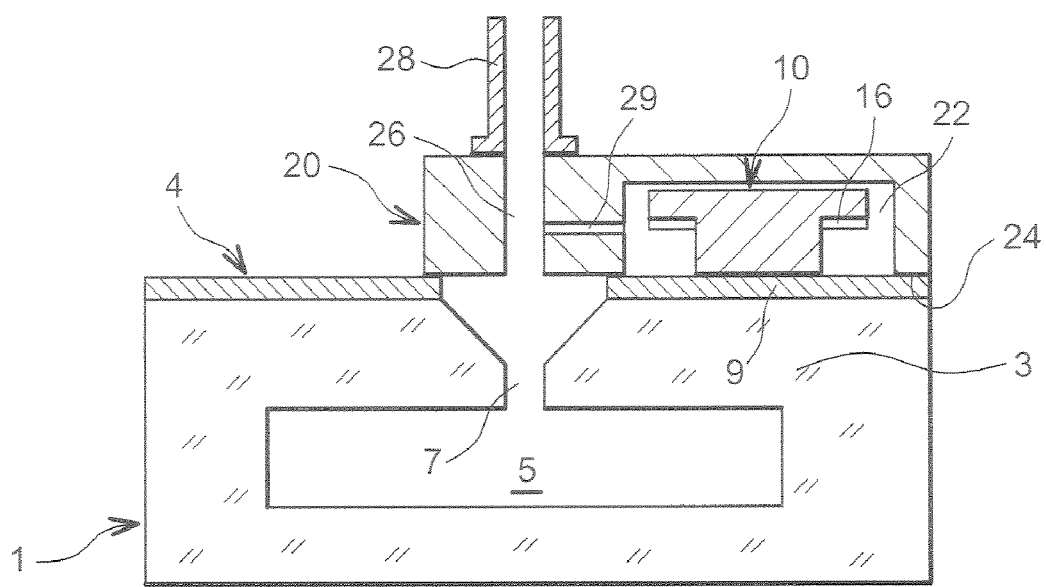
FIGS. 3A-3C show diagrammatically the filling and sealing of a cavity according to a preferred embodiment of the invention.

In order to fit the cap 10, the latter is advantageously part of a sealing device 20 as shown in FIG. 3; in one preferred embodiment, the cap 10 is located in a first cavity 22 of the device 20 and is adjacent to a contact surface 24 of the device 20 with the component 1. The first cavity 22 is advantageously slightly larger in size than the cover 14 so that the cap 10 "does not float" in the cavity 22 but is held relatively in place by the walls without being attached to them, which is to say that the cap 10 is free to move in one direction, downwards, in the cavity 22 (like a drawer). The first cavity 22 is open, so that the cap 10 "drops" as soon as it is opposite an empty space such as the mouth 8.

The cap 10 may be placed in the cavity 22 before the device 20 is positioned on the component 1, or the cap may be fitted onto the surface 4 of the component, relatively distant from the mouth 8, then the device 20 is positioned so that the cap 10 is positioned in the cavity 22.

Furthermore, in order to carry out the creation of the vacuum and the filling of the cavity 5 with the same device 20 as for the sealing, it may be advantageous for the device 20 to have a second cavity 26 used for the other operations. Advantageously, the second cavity 26 traverses the device 20 completely and may be connected, for example by a tube 28, to means for pumping and/or filling the cavity 5; as previously, the second cavity 26 may be open at one of its ends, or it may be temporarily closed by membrane type means. It may be advantageous for the second cavity 26 to be brought into communication with the first cavity 22 in order to ensure that the atmosphere is the same between the first cavity 22 and the cavity 5 of the microelectronic component 1, for example via a duct 29 as shown in FIG. 3, or preferably by a groove on the surface 24 of the device 20 in contact with the component 1. In fact, when the tube 28 places the cavity 5 under vacuum for example, it is preferable to simultaneously place the cavity 22 under vacuum in order to avoid any contamination.

It is also possible, even though this has not been shown, to use a device 20 comprising for example a cavity for the creation of the vacuum and a cavity for filling, as described above in relation to the state of the art.

The contact surface 24 of the sealing device 20 is made to slide, in a translation or rotation movement, on the external surface 4 of the component 1. Advantageously, the surface 24 is flat.

During the phases of creating the vacuum and/or filling (FIG. 3A), the means permitting the filling and/or creation of the vacuum 26, 28 are placed opposite the orifice 7 of the component 1. The environment of the cavity 5 is then prepared as required for its use; for example, pumping reduces the pressure in the cavity 5 which is then filled by a liquid of suitable properties. Advantageously, the same atmosphere is used in the cavity 22.

Figure 3B:
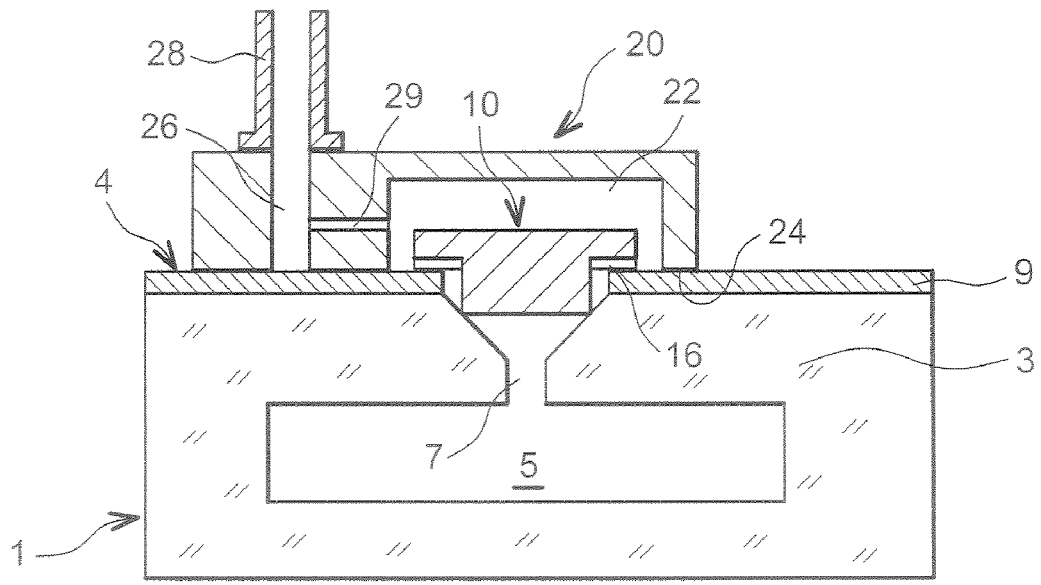

In order to seal the cavity 5, which is to say to obstruct the orifice 7, as shown in FIG. 3B, the device 20 is made to slide in a translation or rotation movement, on the surface 4 so as to bring the orifice 7 into contact with the cap 10. To ensure that it is hermetic during the sliding of the device 20 on the component 1, a vacuum grease, for example of the silicon or "High Vacuum" grease type, may be used between the external surface 4 of the component 1 and the lower surface 24 of the device 20. The cap 10 partially penetrates into the mouth 8, mainly due to gravity.

Figure 3C:
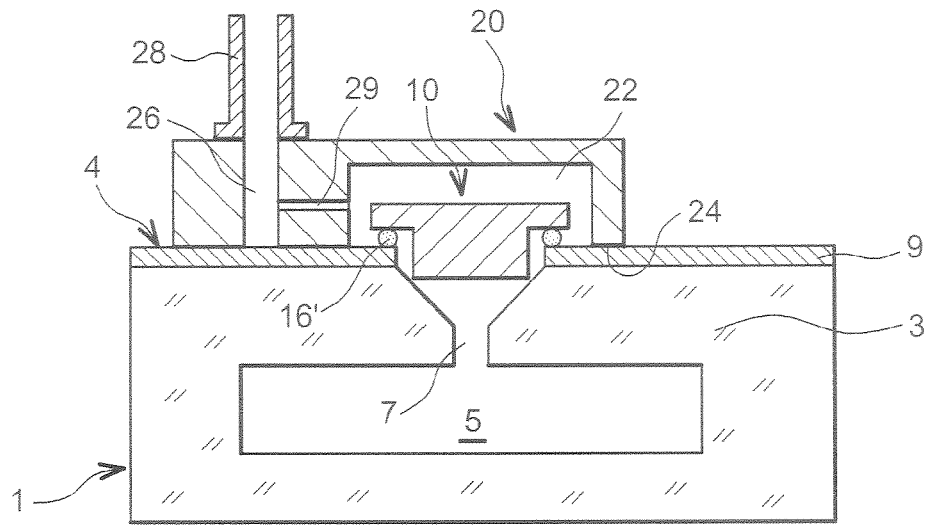

The meltable material 16 is then brought to melting temperature so that it spreads over the metallization layer 9 that has been applied beforehand around the filling orifice 7 and the hermetic seal is created: FIG. 3C. The shape of the cap 10 is preferably such that the meltable material 16' does not spread inside the cavity 5, for example the size of the base 12 is greater than the size of the orifice 7.

It is possible to place the meltable material 16 around the filling orifice 7 also, so that the material 16 on the cover 14 and around the mouth 8 mix together after heating.

Figure 4:
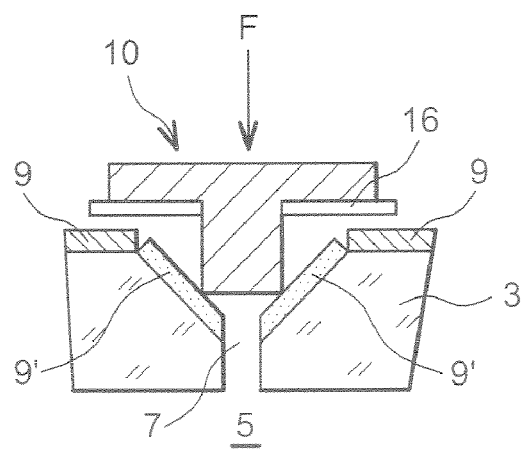
FIG. 4 shows another sealing process.

In one preferred embodiment, after the cap 10 has been fitted, illustrated in FIG. 3B, the filling liquid of the cavity 5 that may be condensed on the metallization layer 9 is evacuated by a second pumping operation. The cap 10 can then be held in place by the pressure F of a tool: FIG. 4.

Such a pressure tool may be used regardless in order to limit the leaks of liquid from the cavity 5 while the meltable material 16 is being welded, or even to position more accurately the cap 10 in the mouth 8. A film 9' of material that is inert with respect to the fluid injected into the cavity 5 and compatible for the vacuum, for example copper or silicon, may in this case be deposited, at the periphery of the orifice 7, on the walls of the mouth 8 or under the cap 10, for the sealing and to limit the risks of breakage.

In the event of the use of pressure force F by a tool, an adapted hole is preferably made in the upper surface of the first cavity 22 containing the cap 10. The pressure tool F/device 20 connection is then made using traditional seals for the vacuum (metal or Viton™).

The device 20 may be made of different appropriate materials. In particular, in the case of the meltable material 16 being melted by laser, it may be preferable to choose as material for the device 20 a material that is transparent to the wavelength used, for example an infrared wavelength emitted for the melting; for other melting processes of the material 16, or other wavelengths, the device 20 may also be made of glass, which may be polished and machined using traditional microelectronic techniques, for example by KOH, known to those skilled in the art. The device 20 may also be formed of several materials.

The connection to the filling system may be made using a tube 28 made of glass brazed to the glass of the device 20.

The cap 10 is preferably made from the same material as the envelope 3 of the cavity 5, for example silicon. In this case, the meltable material 16 may be deposited using electrolysis, and the cap 10 machined using traditional microelectronic etching techniques.

Figure 5A:
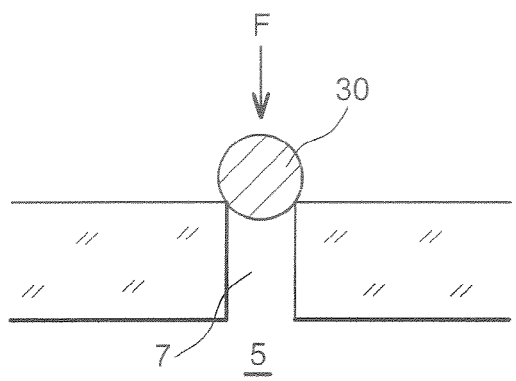
FIGS. 5A and 5B show an alternative for the plastic deformation of the cap.
Figure 5B:
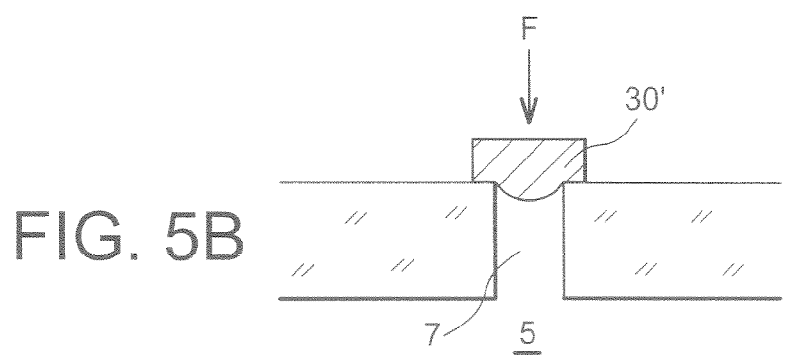

As stated above, the shape of the cap 10 is only illustrative. Furthermore, the association of an inert material with the meltable material is also only a preferred embodiment: it is possible to only have one plastically deformable material for the cap 10. One variant for the sealing is thus the use of a soft metal ball 30, such as indium for example: FIG. 5A. The filling and sealing process is the same as previously, but the cap 30' in this case is crushed by a tool above the orifice 7: see FIG. 5B.

In this embodiment in particular, it is obvious that depending on the shape of the orifice 7, and in the presence for example of a mouth 8, it is possible to have an external surface 4 of the electronic component 1 that is flat after sealing.

In order to correctly position the cap 10 or the ball 30 above the orifice 7, when the device 20 slides in particular between several functional positions, it is possible to machine the lower surface 24 of the device 20 in order to act as a guide, for example by suitable marking. Advantageously, a precise movement of the device 20 with respect to the component 1 to be filled may be carried out by means of notches or stops or grooves to allow the device 20 to be aligned with the hole 7, 8.

The use of such sealing with a cap has the advantage of making possible the creation of a vacuum and the filling of a cavity by using an orifice that potentially can be large in sized (of the order of 1 mm), thus permitting the time required to create the vacuum and fill the cavity to be reduced with respect to the usual capillary methods. Furthermore, the mechanical stresses on the component 1 to be filled, due to the cavity 5/vacuum pump connection for example, are transferred to the sealing device 20, limiting the risks of breakage at the level of the tube 28.

Moreover, in the case of very flat structures, in particular those which do not exceed several millimeters in thickness, the process of the invention permits the filling to be made from above instead of via the side of the cavity 5, while conserving the final flatness of the component 1. Similarly, the elimination of the tip which results from this method permits greater compactness of the final object, for the filling of miniature components.

Such a sealing device, as well as the associated process, are thus particularly useful for making flat and miniaturised silicon caloducts, as well as for any fluidic systems made on a flat substrate, into which a specific fluid is to be introduced, excluding as much as possible any other types or incondensable gases.

The invention claimed is:

1. A hermetic sealing device of a microelectronic component including a cavity opening via an orifice onto a first surface, the sealing device comprising:
   a second surface configured to cooperate with the first surface; and
   a cap adjacent to the second surface,
   wherein at least one part of the cap is a plastically deformable material, and
   the hermetic sealing device is configured to position the cap partially into the orifice of the cavity, in its non deformed state, and to hermetically obstruct the orifice of the microelectronic component with the cap in a plastic deformed state.

2. The hermetic sealing device according to claim 1, further comprising a first cavity open on the second surface, in which the cap is housed.

3. The hermetic sealing device according to claim 1, further comprising a first cavity that traverses and is open, or configured to open, onto the second surface, located at a distance that is not zero from the cap.

4. The hermetic sealing device according to claim 1, in which the plastically deformable material is a soft metal.

5. The hermetic sealing device according to claim 1, in which the cap comprises an inert core and a part made of meltable material.

6. The hermetic sealing device according to claim 1, further comprising means for connecting the cap to a pressure tool.

7. The hermetic sealing device according to claim 1, in which the cap substantially has a shape of a mushroom comprising a base and a cover made of a semi-conductor material, and one part in meltable material located on the surface of the cover attached to the base, wherein the height of the cap between the surface of the cover opposite the base and the end of the base opposite the cover is between 100 µm and 1 mm.

8. A system comprising the hermetic sealing device according to claim 1 and the microelectronic component comprising the cavity opening via the orifice onto the first surface, that can slide with respect to the second surface of the hermetic sealing device.

9. The system according to claim 8, in which the first and the second surface are flat.

10. The system according to claim 8, in which the first surface of the component comprises a metallic coating.

11. The system according to claim 8, in which the first surface comprises a deposit of meltable material.

12. The system according to claim 8, in which the cap is composed at least partially of a same material as a layer of the component adjacent to the first surface.

13. The system according to claim 8, further comprising guiding means for controlling movement of the device with respect to the component.

14. A hermetic sealing process of a cavity of a microelectronic component opening via an orifice, comprising:
   providing a hermetic sealing device for the microelectronic component, the hermetic sealing device including a second surface configured to cooperate with a first surface, and a cap adjacent to the second surface, wherein at least one part of the cap is a plastically deformable material, and the hermetic sealing device is configured to position the cap partially into the orifice of the cavity, in its non deformed state, and to hermetically obstruct the orifice of the microelectronic component with the cap in a plastic deformed state;

using the hermetic sealing device to position the cap partially into the orifice of the cavity, in its non deformed state; and plastically deforming the cap so as to obstruct the orifice hermetically.

15. The process according to claim 14, in which the cap is configured to be in light contact with a surface of the component after plastic deformation.

16. The process according to claim 14, in which the device is positioned by sliding the device along the microelectronic component.

17. The process according to claim 14, comprising positioning of the device on the component, filling of the cavity, and sliding of the device.

18. A hermetic sealing device of a first surface of a microelectronic component, the sealing device comprising:
  a second surface;
  first and second cavities opening onto, or configured to communicate with, the second surface, wherein the second cavity traverses,
  wherein a cap is housed inside the first cavity and adjacent to the second surface, and wherein at least one part of the cap is a plastically deformable material and the hermetic sealing device is configured to position the cap partially into an orifice of the microelectronic component in its non-deformed state, and to hermetically obstruct the orifice of the microelectronic component with the cap in a plastic deformed state.

19. The hermetic sealing device according to claim 18, further comprising means for connecting the second cavity to a system for pumping or filling.

20. The hermetic sealing device according to claim 18, further comprising means for bringing into communication the first cavity and the second cavity.

* * * * *